United States Patent
Booth, Jr. et al.

(10) Patent No.: US 8,384,145 B2
(45) Date of Patent: Feb. 26, 2013

(54) NON-VOLATILE MEMORY DEVICE USING HOT-CARRIER INJECTION

(75) Inventors: Roger Allen Booth, Jr., Hopewell Junction, NY (US); Kangguo Cheng, Albany, NY (US); Chandrasekharan Kothandaraman, Hopewell Junction, NY (US); Chengwen Pei, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 12/692,923

(22) Filed: Jan. 25, 2010

(65) Prior Publication Data

US 2010/0193854 A1    Aug. 5, 2010

Related U.S. Application Data

(60) Provisional application No. 61/149,536, filed on Feb. 3, 2009.

(51) Int. Cl.
*H01L 29/76* (2006.01)

(52) U.S. Cl. .............. 257/314; 257/344; 257/E21.4; 438/197

(58) Field of Classification Search .............. 257/314, 257/E21.4, 344; 438/197
See application file for complete search history.

(56) References Cited

U.S. PATENT DOCUMENTS

| | | | | |
|---|---|---|---|---|
| 5,494,836 A | * | 2/1996 | Imai | 438/312 |
| 6,222,951 B1 | * | 4/2001 | Huang | 385/14 |
| 6,717,203 B2 | | 4/2004 | Wong et al. | |
| 6,730,957 B1 | | 5/2004 | Jang | |
| 6,849,516 B2 | * | 2/2005 | Feudel et al. | 438/303 |
| 7,067,379 B2 | * | 6/2006 | Wen et al. | 438/300 |
| 7,112,490 B1 | | 9/2006 | Hong et al. | |
| 7,250,340 B2 | | 7/2007 | Swift et al. | |
| 7,396,407 B2 | * | 7/2008 | Saenger et al. | 117/63 |
| 7,652,332 B2 | * | 1/2010 | Cartier et al. | 257/347 |
| 7,768,079 B2 | * | 8/2010 | Sandford et al. | 257/410 |
| 2004/0007732 A1 | | 1/2004 | Wong et al. | |
| 2004/0087096 A1 | | 5/2004 | Jang | |
| 2007/0134859 A1 | * | 6/2007 | Curello et al. | 438/151 |

* cited by examiner

*Primary Examiner* — John C Ingham
(74) *Attorney, Agent, or Firm* — Scully, Scott, Murphy & Presser, P.C.; Joseph P. Abate, Esq.

(57) ABSTRACT

Each of a hot-carrier non-volatile memory device and a method for fabricating the hot carrier non-volatile memory device is predicated upon a semiconductor structure and related method that includes a metal oxide semiconductor field effect transistor structure. The semiconductor structure and related method include at least one of: (1) a spacer that comprises a dielectric material having a dielectric constant greater than 7 (for enhanced hot carrier derived charge capture and retention); and (2) a drain region that comprises a semiconductor material that has a narrower bandgap than a bandgap of a semiconductor material from which is comprised a channel region (for enhanced impact ionization and charged carrier generation).

11 Claims, 2 Drawing Sheets

NON-VOLATILE MEMORY DEVICE USING HOT-CARRIER INJECTION

This non-provisional application claims the benefit of the provisional application filed with the U.S. Patent and Trademark Office as Ser. No. 61/149,536 entitled "Non-Volatile Memory Device Using Hot-Carrier Injection", filed Feb. 3, 2009.

BACKGROUND

1. Field of the Invention

The invention relates generally to non-volatile memory devices. More particularly, the invention relates to hot-carrier non-volatile memory devices with enhanced performance.

2. Description of the Related Art

In addition to resistors, diodes, capacitors, conventional field effect transistors and conventional bipolar transistors, semiconductor circuits now routinely also include non-volatile memory devices. Non-volatile memory devices are often employed in applications that require permanent, or at least semi-permanent, digital data storage. Such non-volatile memory devices are particularly desirable for providing permanent or semi-permanent digital data storage within the context of applications such as but not limited to digital imaging applications.

A particular type of non-volatile memory device that has relatively recently evolved within semiconductor fabrication technology is a hot-carrier non-volatile memory device, which is typically a semiconductor device. Hot-carrier non-volatile memory devices are generally predicated upon accelerated hot-carrier impact ionization into electron-hole pairs and injection into designated charge capture and trapping material layers. Hot-carrier non-volatile memory devices are desirable insofar as they are predicated upon conventional and well-characterized hot-carrier phenomena that under certain circumstances may become more prevalent as semiconductor device dimensions and semiconductor structure dimensions downwardly scale. Notwithstanding, hot-carrier non-volatile memory devices may be undesirable under alternative circumstances where reliable operation of a particular hot-carrier non-volatile memory device requires an increased hot-carrier non-volatile memory device operating voltage.

Various hot-carrier non-volatile memory devices are known in the semiconductor fabrication art.

For example, Wong et al., in U.S. Pub No. 2004/0007732 and U.S. Pat. No. 6,717,203, teaches a hot-carrier non-volatile memory device that is highly scalable. This particular hot-carrier non-volatile memory device includes a lateral bipolar transistor as a charge injector for injecting electrons from a semiconductor substrate into a floating gate that is located over and separated from the semiconductor substrate within the hot-carrier non-volatile memory device.

In addition, Jang, in U.S. Pub. No. 2004/0087096 and U.S. Pat. No. 6,730,957 teaches a hot-carrier non-volatile memory device that is compatible with logic devices. This particular hot-carrier non-volatile memory device includes a particular dielectric layer located interposed between a spacer and a semiconductor substrate as an electron capture and retention material.

Further, Hong et al., in U.S. Pat. No. 7,112,490, and Swift in U.S. Pat. No. 7,112,490 each teach a hot-carrier non-volatile memory device that is fabricated within a trench within a semiconductor substrate. These particular hot-carrier non-volatile memory devices use a discontinuous storage element layer conformally lining the trench but not filling the trench, and a conductor spacer located upon the discontinuous storage element layer as a control gate.

Due to the possibility of ease in fabrication, and also the existence of a mechanism of operation that is predicated upon a generally well-characterized hot-carrier injection phenomenon, hot-carrier non-volatile memory devices are likely to be of continued importance as semiconductor technology advances. For that reason, desirable are hot-carrier non-volatile memory devices with enhanced performance, and methods for fabrication of those hot-carrier non-volatile memory devices with enhanced performance.

SUMMARY

The invention provides a semiconductor structure that includes a hot-carrier non-volatile memory device and a method for fabricating the semiconductor structure that includes the hot-carrier non-volatile memory device. The foregoing hot-carrier non-volatile memory device and related method are predicated upon a metal oxide semiconductor field effect transistor structure that includes at least one of: (1) a spacer that comprises a high relative (i.e., to air) dielectric constant material (i.e., having a relative dielectric constant greater than 7, typically 20, with increased preferences for relative dielectric constants greater than 30, 50, 70 or 100); and (2) a drain region that comprises a semiconductor material having a narrower bandgap than the bandgap of a semiconductor material from which is comprised a channel region within the hot-carrier non-volatile memory device. "Relative" (i.e., to air) dielectric constants are intended within the remainder of this disclosure, even if not specifically so stated.

The spacer that comprises the comparatively high (i.e., in comparison with a silicon oxide material) dielectric constant material provides the hot-carrier non-volatile memory device with enhanced hot-carrier impact ionized electron capture and retention capabilities due to a lower charge carrier injection barrier for the relatively high dielectric constant dielectric material in comparison with, for example, the silicon oxide material.

The drain region that comprises the semiconductor material that has the narrower bandgap in comparison with the semiconductor material from which is comprised the channel region provides the hot-carrier non-volatile memory device with a more effective impact ionization for forming charged carrier pairs, and thus an enhanced charged carrier pair generation at a desirable location beneath a spacer within the hot-carrier non-volatile memory device.

A particular semiconductor structure in accordance with the invention that includes a hot-carrier non-volatile memory device includes a semiconductor substrate. This particular semiconductor structure also includes a gate dielectric located upon the semiconductor substrate. This particular semiconductor structure also includes a gate located upon the gate dielectric and aligned above a channel region within the semiconductor substrate. This particular semiconductor structure also includes a spacer located upon a sidewall of the gate and contacting the semiconductor substrate. This particular semiconductor structure also includes a source region and a drain region located within the semiconductor substrate and separated by the channel region. Within this particular semiconductor structure, at least one of: (1) the spacer comprises a dielectric material having a dielectric constant greater than 7; and (2) the drain region comprises a semiconductor material having a narrower bandgap than a semiconductor material from which is comprised the channel region.

A particular method for fabricating a semiconductor structure in accordance with the invention that includes a hot-carrier non-volatile memory device includes providing a semiconductor substrate. This particular method also includes forming a gate dielectric upon the semiconductor substrate. This particular method also includes forming a gate upon the gate dielectric and aligned above a channel region within the semiconductor substrate. This particular method also includes forming a spacer upon a sidewall of the gate and upon the semiconductor substrate. This particular method also includes forming a source region and a drain region within the semiconductor substrate and separated by the channel region. Within the particular method, at least one of: (1) the spacer comprises a dielectric material having a dielectric constant greater than 7; and (2) the drain region comprises a semiconductor material having a narrower bandgap than a semiconductor material from which is comprised the channel region.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENTS

The invention, which includes a semiconductor structure including a hot-carrier non-volatile memory device and a method for fabricating the semiconductor structure that includes the hot-carrier non-volatile memory device, is understood within the context of the description set forth below. The description set forth below is understood within the context of the drawings described above. Since the drawings are intended for illustrative purposes, the drawings are not necessarily drawn to scale.

FIG. 1 to FIG. 5 shows a series of schematic cross-sectional diagrams illustrating the results of progressive stages in fabricating a semiconductor structure that encompasses a hot-carrier non-volatile memory device in accordance with multiple embodiments of the invention. The particular multiple embodiments encompassed by the schematic cross-sectional diagrams of FIG. 1 to FIG. 5 comprise several preferred embodiments of the invention.

Figure 1:
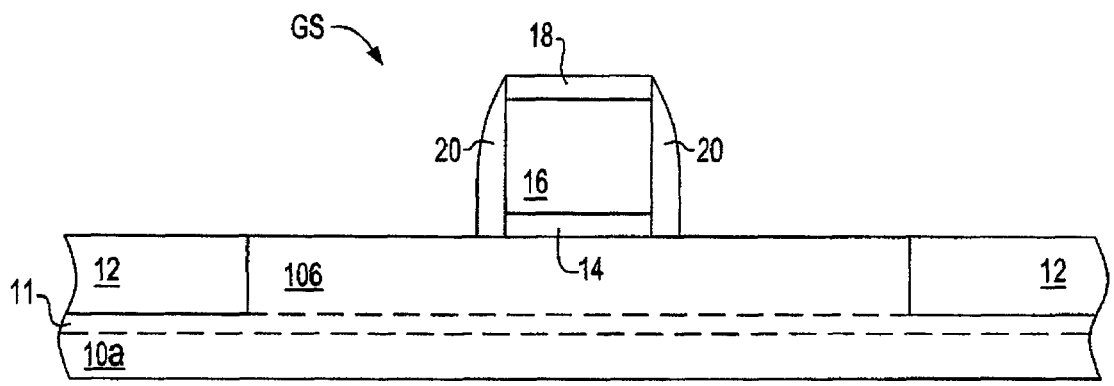
FIG. 1 to FIG. 5 shows a series of schematic cross-sectional diagrams illustrating the results of progressive gate stack formation (FIG. 1), semiconductor substrate etching (FIG. 2), source or drain layer backfill (FIG. 3), sacrificial spacer stripping (FIG. 4) and source or drain region formation (FIG. 5) process steps that may be used when fabricating a semiconductor structure that encompasses a hot-carrier non-volatile memory device in accordance with multiple embodiments of the invention.

Specifically, FIG. 1 shows a schematic cross-sectional diagram of the semiconductor structure at an early stage in the fabrication thereof in accordance with the preferred embodiments of the invention.

FIG. 1 first shows a base semiconductor substrate 10a that is separated from a surface semiconductor layer 10b by an optional buried dielectric layer 11. The base semiconductor substrate 10a and the surface semiconductor layer 10b are intended to comprise a bulk semiconductor substrate 10 as discussed further below. An isolation region 12 is located embedded within the surface semiconductor layer 10b and contacting the optional buried dielectric layer 11 to bound and define an active region that includes the surface semiconductor layer 10b.

In an aggregate, the base semiconductor substrate 10a, the optional buried dielectric layer 11 and the surface semiconductor layer 10b comprise a semiconductor-on-insulator substrate.

The base semiconductor substrate 10a and the surface semiconductor layer 10b may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, each of the base semiconductor substrate 10a and surface semiconductor layer 10b comprises a silicon semiconductor material.

The optional buried dielectric layer 11, as well as the isolation region 12, may comprise any of several dielectric materials. Non-limiting examples include oxides, nitrides and oxynitrides, particularly of silicon, but oxides, nitrides and oxynitrides of other elements are not excluded. The optional buried dielectric layer 11 and the isolation region 12 may comprise a crystalline or a non-crystalline dielectric material, with crystalline dielectrics under certain circumstances being highly preferred. The optional buried dielectric layer 11 and the isolation region 12 may be formed using any of several methods. Non-limiting examples include ion implantation methods, thermal or plasma oxidation or nitridation methods, chemical vapor deposition methods and physical vapor deposition methods. Typically, each of the optional buried dielectric layer 11 and the isolation region 12 comprises at least in-part an oxide of the semiconductor material from which is comprised the semiconductor substrate 10. Typically, the optional buried dielectric layer 11 has a thickness from 5 to about 50 nanometers, while the isolation region 12 has a thickness that generally corresponds with the surface semiconductor layer 10b.

The surface semiconductor layer 10b and the base semiconductor substrate 10a may comprise either identical or different semiconductor materials with respect to chemical composition, dopant concentration and crystallographic orientation. Typically, the surface semiconductor layer 10b has a thickness from 20 to 50 nanometers, which is equal to the thickness of the isolation region 12.

The semiconductor-on-insulator substrate that is illustrated in FIG. 1 may be fabricated using any of several methods. Non-limiting examples include lamination methods, layer transfer methods and separation by implantation of oxygen (SIMOX) methods.

Although FIG. 1 illustrates the embodiments within the context of a semiconductor-on-insulator substrate comprising the base semiconductor substrate 10a, the optional buried dielectric layer 11 and the surface semiconductor layer 10b, neither the embodiments, nor the invention is necessarily so limited. Rather, the embodiments and the invention may alternatively be practiced using a bulk semiconductor substrate (that would otherwise result from absence of the optional buried dielectric layer 11 under circumstances where the base semiconductor substrate 10a and the surface semiconductor layer 10b of the semiconductor-on-insulator substrate have identical chemical composition and crystallographic orientation). The embodiments also contemplate use of a hybrid orientation (HOT) substrate that has multiple crystallographic orientations within a single semiconductor substrate.

For clarity, remaining diagrams within the preferred embodiments will illustrate the embodiments within the context of a sole bulk semiconductor substrate 10 absent the buried dielectric layer 11.

FIG. 1 also shows (in cross-section) a gate stack GS for use within a field effect transistor device, where the gate stack GS is located and formed upon the surface semiconductor layer 10b of the semiconductor-on-insulator substrate. The gate stack GS comprises: (1) a gate dielectric 14 located and formed upon the surface semiconductor layer 10b; (2) a gate 16 located and formed aligned (although such is not necessarily a requirement of the embodiments of the invention) upon the gate dielectric 14; (3) a capping layer 18 located and formed aligned upon the gate 16; and (4) an optional sacrificial spacer 20 (illustrated as plural layers in cross-section, but intended as a single layer encircling the capping layer 18, the gate 16 and the gate dielectric 14 in plan-view) located and formed adjoining a pair of opposite sidewalls of the gate dielectric 14, the gate 16 and the capping layer 18. Each of the foregoing layers and structures may comprise materials and have dimensions that are conventional in the semiconductor fabrication art. Each of the foregoing layers and structures may also be formed using methods that are conventional in the semiconductor fabrication art.

The gate dielectric 14 may comprise conventional dielectric materials such as oxides, nitrides and oxynitrides of silicon that have a dielectric constant from about 4 to about 20, measured in vacuum. Alternatively, the gate dielectric 14 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectric 14 may be formed using any of several methods that are appropriate to the material or materials of composition of the gate dielectric 14. Included, but not limiting are thermal or plasma oxidation or nitridation methods, chemical vapor deposition methods and physical vapor deposition methods. Typically, the gate dielectric 14 comprises a thermal silicon oxide dielectric material that has a thickness from 1 to 7 nanometers.

The gate 16 may comprise materials including, but not limited to certain metals, metal alloys, metal nitrides and metal silicides, as well as laminates thereof and composites thereof. The gate 16 may also comprise doped polysilicon and doped polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate 16 comprises a doped polysilicon material that has a thickness from 60 to 200 nanometers.

The capping layer 18 may comprise any of several capping materials. Dielectric capping materials are most common. The dielectric capping materials may include, but are not limited to: oxides, nitrides and oxynitrides of silicon, but oxides, nitrides and oxynitrides of other elements are not excluded. The dielectric capping materials may be formed using any of the several methods that may be used for forming the optional buried dielectric layer 11 or the isolation region 12 that are illustrated in FIG. 1. Typically, the capping layer 18 comprises a silicon nitride dielectric material that has a thickness from 10 to 30 nanometers.

The optional sacrificial spacer 20 is intended under certain circumstances to provide sidewall protection to the gate 16. The optional sacrificial spacer 20 may comprise materials including, but not limited to conductor materials and dielectric materials. Conductor spacer materials are less common, but are nonetheless known. Dielectric spacer materials are more common. The spacer materials may be formed using methods analogous, equivalent or identical to the methods that are used for forming the capping layer 18. The optional sacrificial spacer 20 is also formed with the distinctive inward pointing spacer shape by using a blanket layer deposition and anisotropic etchback method that requires that the optional sacrificial spacer 20 comprises a different spacer material from the capping layer 18. Typically, the optional sacrificial spacer 20 comprises a silicon oxide dielectric material when the capping layer 18 comprises a silicon nitride dielectric material, although the embodiments are not so limited. Typically the optional sacrificial spacer 20 has a linewidth of up to 10 nanometers projected upon the active region of the surface semiconductor layer 10b.

Figure 2:
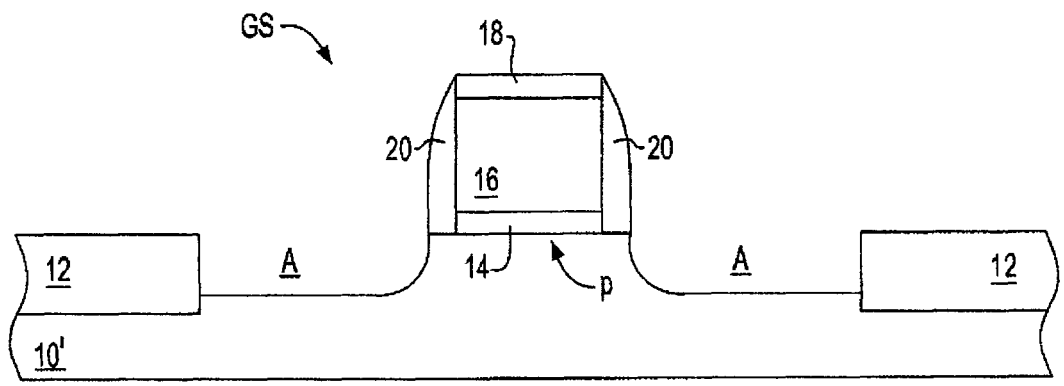

FIG. 2 shows the results of etching a semiconductor substrate 10 that results from the base semiconductor substrate 10a and the surface semiconductor layer 10b that are illustrated in FIG. 1, absent the optional buried dielectric layer 11, to form a semiconductor substrate 10'. The foregoing etching is effected while using the gate dielectric 14, the gate 16, the capping layer 18 and the optional sacrificial spacer 20 as an etch mask. The foregoing etching provides a pedestal P that includes a channel, located and formed beneath the gate 16, as well as a plurality of apertures A within the semiconductor substrate 10' that is separated by the pedestal P within the semiconductor substrate 10'. Typically, each aperture A is etched for a distance up to 10 nanometers, and preferably from 1 to 10 nanometers, into the semiconductor substrate 10'.

Although FIG. 2 illustrates etching into both sides semiconductor substrate 10' at the edges of the gate stack to form the plurality of apertures A that is separated by the pedestal P, the instant embodiments at a minimum contemplate that there is at least one aperture A at a location intended for a drain side of a field effect transistor to be subsequently formed, and that includes at least part of the gate stack GS.

The semiconductor substrate 10 derived from the base semiconductor substrate 10a and the surface semiconductor layer 10b that is illustrated in FIG. 1 may be etched to provide the semiconductor substrate 10' that is illustrated in FIG. 2 (i.e., including the apertures A), while using etch methods and etch materials that are otherwise generally conventional in the semiconductor fabrication art. Included in particular, but also not limiting, are wet chemical etch methods and materials and dry plasma etch methods and materials. Wet chemical etch methods and materials when not crystallographically specific generally are isotropic etch methods. Dry plasma etch methods and materials are generally anisotropic, with notable exceptions.

Figure 3:
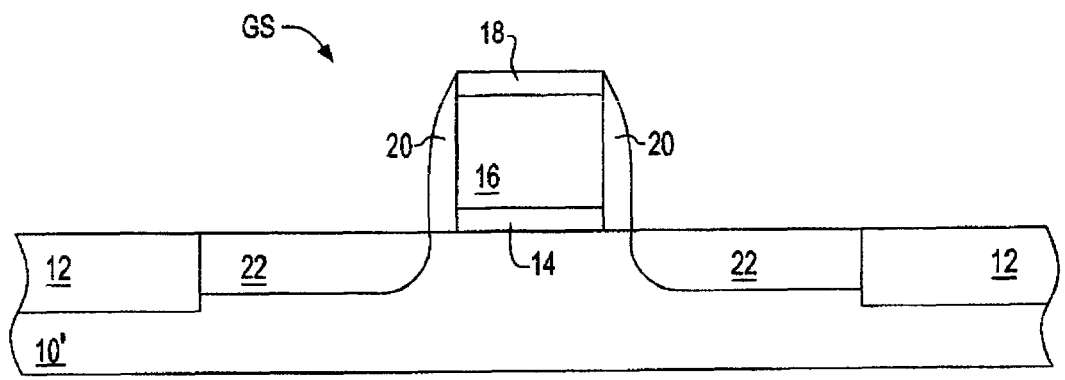

FIG. 3 shows the results of backfilling the apertures A that are illustrated in FIG. 2 with source or drain layers 22. The source or drain layers 22, in particular within the instant embodiments, comprise a semiconductor material that has a narrower bandgap in comparison with the semiconductor material from which is comprised the pedestal P that includes the channel. Typically, and from a practical perspective, the source or drain layers 22 comprise a silicon-germanium alloy material layer when the channel comprises a silicon semiconductor material, in order to fulfill the foregoing bandgap conditions. The narrower bandgap of the semiconductor material from which is comprised the source or drain layers 22 in comparison with the semiconductor material from which is comprised the channel is desirable insofar as this particular selection of semiconductor materials provides for a more efficient impact ionization at a desirable location when forming charged carrier pairs from hot carriers.

The source or drain layers 22 are typically formed using an epitaxial deposition method that uses appropriate silicon source materials and germanium source materials. Typically, the source or drain layers 22 comprise 25 atomic percent germanium and 75 atomic percent silicon.

Figure 4:
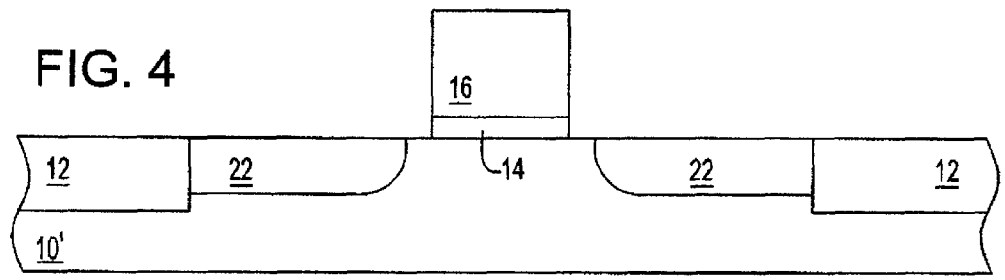

FIG. 4 shows the results of stripping the capping layer 18 and the sacrificial spacer 20 from the gate 16 that as illustrated on FIG. 3. Stripping of the capping layer 18 and the sacrificial spacer 20 from the gate 16 that is illustrated in the semiconductor structure of FIG. 3 to provide the semiconductor structure of FIG. 4 may be effected using methods and materials that are otherwise generally conventional in the semiconductor fabrication art. Such etch methods and materials may include, but are not necessarily limited to, wet chemical etch methods and materials and dry plasma etch methods and materials. Wet chemical etch methods and materials are often desirable within the context of stripping the capping layer 18 and the spacer 20 from the semiconductor structure of FIG. 3 to provide the semiconductor structure of FIG. 4 insofar as wet chemical etch methods and materials provide for less damage to exposed portions of the semiconductor structure of FIG. 3 or FIG. 4. In general, and while not limiting the embodiments or the invention, silicon oxide dielectric materials may be stripped using aqueous hydrofluoric acid etchants while silicon nitride dielectric materials may be stripped using aqueous phosphoric acid etchants.

Figure 5:
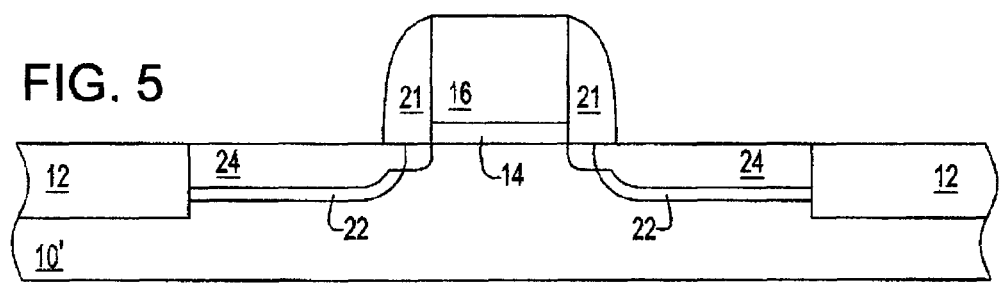

FIG. 5 first shows a spacer 21 located and formed adjoining the sidewalls of the gate 16 and the gate dielectric 14. FIG. 5 also shows a plurality of source or drain regions 24 located and formed in-part within the source or drain layers 22.

Figure 6:
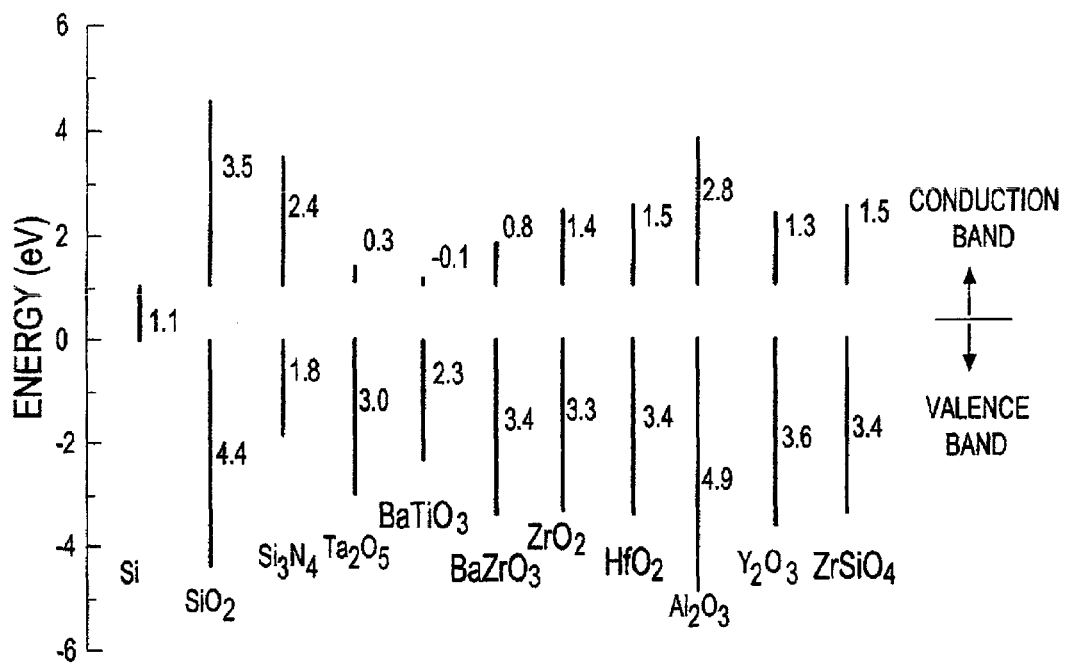
FIG. 6 shows a graph of Energy (i.e., conduction band offset and valence band offset) versus Material for various dielectric materials from which may be comprised spacers within a semiconductor structure including a hot-carrier non-volatile memory device in accordance with the multiple embodiments of the invention.

Within the instant embodiments, the spacer 21 comprises a higher dielectric constant dielectric material having a dielectric constant greater than 7 and more typically from 7 to 50, more preferably greater than about 50, still more preferably greater than about 70 and most preferably greater than about 100. Such a higher dielectric constant dielectric material is desirable for the spacer 21 insofar as such a higher dielectric constant dielectric material provides for a lower charge carrier injection barrier than a silicon oxide spacer material. For reference purposes, FIG. 6 shows conduction band and valence band energies for various materials, as reposted by Robertson et al., J. Vac. Sci. Technol. B, vol. 183, p. 1785 (2000). Attention is directed to conduction band energies which are lower for higher dielectric constant dielectric materials (i.e., in comparison with silicon oxide), and which provide a charge carrier injection barrier within the embodiments and the invention. The spacer 21 is otherwise formed using methods and materials analogous equivalent or identical to the methods and materials that are used for forming the sacrificial spacer 20 that is illustrated in FIG. 1, although the spacer 21 has a greater projected linewidth upon the semiconductor substrate 10' from 5 to about 50 nanometers.

Finally, the source or drain regions 24 comprises a generally conventional dopant that will typically be either an n dopant (for an nFET) or a p dopant (for a pFET). As is understood by a person skilled in the art, the plurality of source or drain regions 24 is formed using a two-step ion implantation method. A first ion implantation process step within the method uses the gate 16, absent the spacer 21, as a mask to form a pair of extension regions each of which extends beneath the spacer 21. A second ion implantation process step uses the gate electrode 18 and the spacer 21 as a mask to form the larger contact region portions of the plurality of source or drain regions 24, while simultaneously incorporating the pair of extension regions. Dopant levels are from about 1e19 to about 1e21 dopant atoms per cubic centimeter within each of the plurality of source or drain regions 24. Extension regions within the plurality of source or drain regions 24 may under certain circumstances be more lightly doped than contact regions with the plurality of source or drain regions 24, although such differential doping concentrations are not a requirement of the embodiments.

FIG. 5 shows a schematic cross-sectional diagram of a semiconductor structure in accordance with particular embodiments of the invention. The semiconductor structure includes a field effect transistor structure that functions a hot-carrier non-volatile memory device. Within the semiconductor structure, the hot carrier non-volatile memory device includes at least one of: (1) a spacer 21 that comprises a dielectric material having a dielectric constant greater than 7, to provide a comparatively lower (in comparison with silicon oxide) charge carrier injection barrier that effect enhanced charged carrier capture and retention; and (2) a drain region 22 that comprises a semiconductor material that has a narrower bandgap that a semiconductor material from which is comprised a channel region within the semiconductor structure, to provide a higher impact ionization efficiency at a desirable location beneath the spacer 21, and in turn provide for more efficient charge carrier generation within the semiconductor structure that comprises the hot-carrier non-volatile memory device.

The preferred embodiments illustrate the invention within the context of: (1) a semiconductor structure that includes both a source region 22 and a drain region 22 comprising a semiconductor material having a narrower bandgap than a bandgap of a semiconductor material from which is comprised a channel region within a hot-carrier non-volatile memory device that comprises the semiconductor structure; as well as (2) a spacer 21 comprising a dielectric material having a dielectric constant greater than 7. However, neither the embodiments nor the invention are necessarily so limited. Rather, independent embodiments of the invention may be realized which include: (1) only the spacer 21 that comprises the dielectric material having the dielectric constant greater than 7; or (2) only the drain region 22 that comprises the semiconductor material having the narrower bandgap that the semiconductor material from which is comprised the channel region. Alternatively, only the foregoing spacer 21 and drain region 22 may be included within a particular embodiment, but absent a similar source region 22 having the narrow bandgap semiconductor material limitation in comparison with the channel.

The preferred embodiments are illustrative of the invention rather than limiting of the invention. Revisions and modifications may be made to methods, materials, structures and dimensions of a semiconductor structure in accordance with the preferred embodiments while still providing a semiconductor structure and a method for fabrication thereof in accordance with the invention further in accordance with the accompanying claims.

What is claimed is:

1. A hot carrier non-volatile memory device comprising:
a semiconductor substrate;
a gate dielectric located upon the semiconductor substrate;

a gate located upon the gate dielectric and aligned above a channel region within the semiconductor substrate;

a spacer located upon a sidewall of the gate and contacting the semiconductor substrate, said spacer having a dielectric constant that is greater than 7, wherein the spacer having a dielectric constant that is greater than 7 provides enhanced hot-carrier impact ionized electron capture and retention capabilities in the hot carrier non-volatile memory device that is due to a lower charge carrier injection barrier for the spacer having the dielectric constant that is greater than 7 in comparison to a similarly structured memory device having a silicon oxide spacer; and a source region and a drain region located within the semiconductor substrate and separated by the channel region, wherein the drain region comprises a semiconductor material having a narrower bandgap than a semiconductor material from which is comprised the channel, wherein the semiconductor material having the narrower bandgap is not present in the source region, wherein the drain region having the semiconductor material of the narrow bandgap provides the hot-carrier non-volatile memory device with increased impact ionization for forming charged carrier pairs in comparison to the similarly structured memory device having a channel region and drain region with a same bandgap, said drain region of the hot carrier non-volatile memory device having an enhanced charged carrier pair generation region beneath the spacer when compared to the similarly structured memory device.

2. The hot carrier non-volatile memory device of claim 1 wherein the semiconductor substrate comprises a bulk semiconductor substrate.

3. The hot carrier non-volatile memory device of claim 1 wherein the semiconductor substrate comprises a semiconductor-on-insulator substrate.

4. The hot carrier non-volatile memory device of claim 1 wherein the semiconductor substrate comprises a hybrid orientation substrate.

5. The hot carrier non-volatile memory device of claim 1 wherein the spacer comprises a dielectric material having a dielectric constant greater than 50.

6. The hot carrier non-volatile memory device of claim 1 wherein the spacer comprises a dielectric material having a dielectric constant greater than 70.

7. The hot carrier non-volatile memory device of claim 1 wherein the spacer comprises a dielectric material having a dielectric constant greater than 100.

8. A method for fabricating a hot carrier non-volatile memory device comprising:

providing a semiconductor substrate;

forming a gate dielectric upon the semiconductor substrate;

forming a gate upon the gate dielectric and aligned above a channel region within the semiconductor substrate;

forming a spacer upon a sidewall of the gate and upon the semiconductor substrate, said spacer having a dielectric constant that is greater than 7, wherein the spacer having a dielectric constant that is greater than 7 provides enhanced hot-carrier impact ionized electron capture and retention capabilities in the hot carrier non-volatile memory device that is due to a lower charge carrier injection barrier for the spacer having the dielectric constant that is greater than 7 in comparison to a similarly structured memory device having a silicon oxide spacer; and forming a source region and a drain region within the semiconductor substrate and separated by the channel, wherein the drain region comprises a semiconductor material having a narrower bandgap than a semiconductor material from which is comprised the channel, wherein the semiconductor material having the narrower bandgap is not present in the source region, wherein the drain region having the semiconductor material of the narrow bandgap provides the hot-carrier non-volatile memory device with increased impact ionization for forming charged carrier pairs in comparison to the similarly structured memory device having a channel region and drain region with a same bandgap, said drain region of the hot carrier non-volatile memory device having an enhanced charged carrier pair generation region beneath the spacer when compared to the similarly structured memory device.

9. The method of claim 8 wherein the spacer comprises a dielectric material having a dielectric constant greater than 50.

10. The method of claim 8 wherein the spacer comprises a dielectric material having a dielectric constant greater than 70.

11. The method of claim 8 wherein the spacer comprises a dielectric material having a dielectric constant greater than 100.

* * * * *